United States Patent [15] 3,663,838

Reimers [45] May 16, 1972

[54] OPTICALLY TRIGGERED THYRISTOR

[72] Inventor: Eberhart Reimers, 7700 Random Run L. #201, Falls Church, Va. 22042

[22] Filed: Oct. 16, 1970

[21] Appl. No.: 81,308

[52] U.S. Cl. ......................307/311, 307/252 K, 307/252 M, 307/279

[51] Int. Cl. ........................................................H03k 17/00

[58] Field of Search..................307/311, 252 K, 252 M, 305, 307/279

[56] References Cited

UNITED STATES PATENTS 3,340,426 9/1967 Elliott ....................................307/311
3,473,084 10/1969 Dodge ....................................307/311
3,486,821 12/1969 Westhauer..............................307/311
3,573,469 4/1971 Riesz ......................................307/311
3,316,404 4/1967 Cruse......................................307/311

*Primary Examiner*—Donald D. Forrer
*Assistant Examiner*—David M. Carter
*Attorney*—Harry M. Saragovitz, Edward J. Kelly and Herbert Berl

[57] ABSTRACT

A thyristor circuit employing optical triggering of the thyristor and wherein the new circuit configuration thereof provides complete isolated gate triggering of the thyristor without implementation of direct or electromagnetic gate coupled triggering means.

5 Claims, 4 Drawing Figures

Patented May 16, 1972 3,663,838

INVENTOR,
Eberhart Reimers

BY: Harry M. Saragovitz,
Edward J. Kelly &
Herbert Berl
ATTORNEYS.

OPTICALLY TRIGGERED THYRISTOR

The invention described herein may be manufactured, used, and licensed by or for the Government for governmental purposes without the payment to me of any royalty thereon.

This invention relates to thyristor circuits and more particularly to a thyristor circuit of such configuration that makes possible complete isolated gate triggering of the thyristor without implementation of directly or electromagnetically gate coupled triggering devices.

In prior art devices, the thyristor is triggered by means directly connected thereto, for example, the pulse transformer of a blocking oscillator having the thyristor directly coupled in the output circuit and control logic elements directly coupled to its input. While such arrangements are generally accepted as a sufficient means, considerable difficulties are encountered when controlling a multitude of thyristors in complex power conversion equipment. These difficulties involve avoiding feedback of power pulses from power converters through the pulse transformer into the control logic, as well as, random noise, leakage currents and inverse feedback which have caused logic malfunction and destruction.

A prime object of the invention is a new and novel thyristor gate trigger circuit wherein means for controlling said circuit is electrically insulated therefrom.

Another object of the invention is a new and novel thyristor gate trigger circuit providing complete isolated gate triggering of the thyristor without direct or electromagnetic gate coupled triggering means.

Another object of the invention is a new and novel thyristor circuit providing complete isolated gate triggering wherein the means for activating said circuit is a light source.

The invention will be more fully apprehended from the following detailed description of a preferred embodiment taken in conjunction with the appended drawings in the several figures of which like numerals identify like elements and in which.

Figure 1:
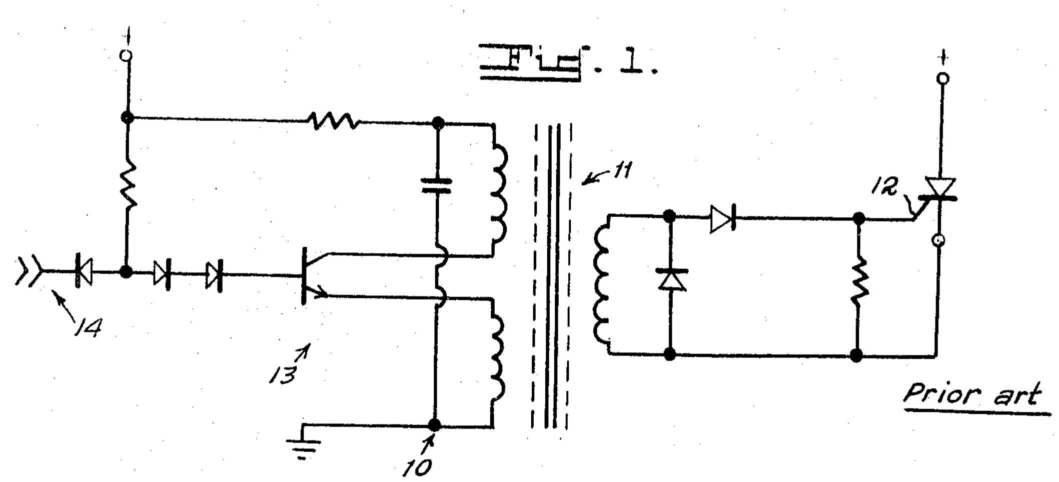
FIG. 1 is a schematic diagram of a prior art thyristor gate trigger circuit.

In FIG. 1 a typical thyristor gate trigger circuit employing a controlled blocking oscillator 10 wherein a pulse transformer 11 has its output coupled to the thyristor gate 12 and its input through oscillatory circuitry components 13 to logic means 14. Thus it can be seen that a malfunction in the thyristor circuit will be reflected through pulse transformer 11 to logic means 14 resulting in the logic means 14 malfunction or destruction.

Figures 2, 3, 4:
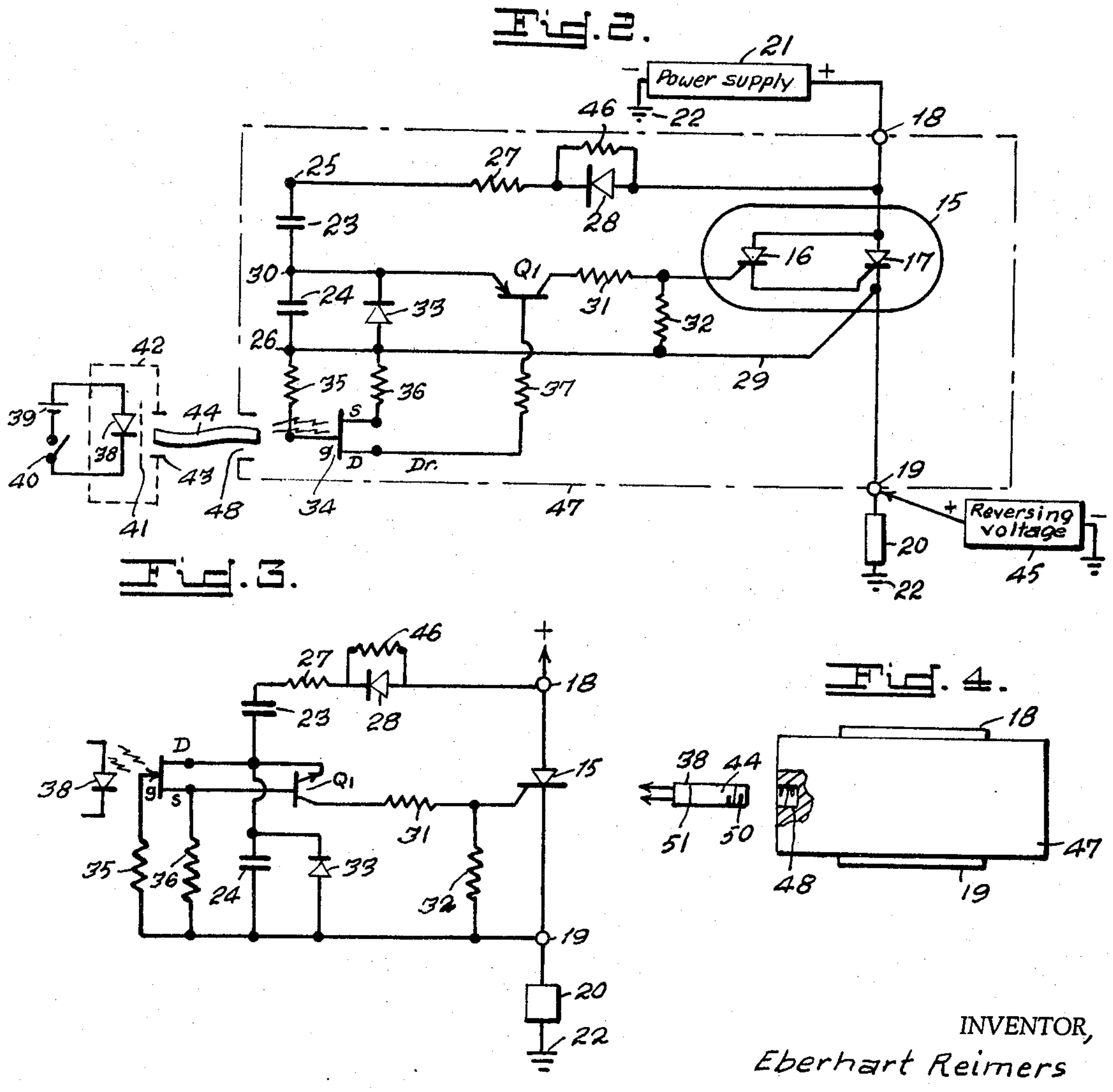
FIG. 2 is a schematic diagram of the thyristor gate trigger circuit of the invention.
FIG. 3 is a schematic diagram of an alternate configuration of the thyristor gate circuit of the invention utilizing a NPN transistor.
FIG. 4 is an elevational view of the circuit of the invention package in accordance with modern techniques.

Referring now to FIG. 2, reference numeral 15 indicates a pilot thyristor 16 and a main thyristor 17. The cathode of pilot thyristor 16 is connected to the gate of thyristor 17 and the anodes thereof connected to form a common junction terminating in an anode terminal 18. The cathode of thyristor 17 is coupled to the cathode terminal 19. Although the main thyristor is shown and described as coupled to a pilot thyristor, it is to be understood that it is not intended to be a limiting factor since a single thyristor may be employed. A power supply 21 has its negative terminal connected to common circuit 22 and its positive terminal connected to the anode terminal 18. A load 20 is connected between the cathode terminal 19 and common circuit 22 whereby thyristor 17 and load are series connected across power supply 21. A capacitor voltage divider comprising series connected capacitors 23 and 24 is provided with terminals 25 and 26, respectively. Terminal 25 is connected through series connected current limiting resistor 27 and blocking diode 28 to anode terminal 18 and hence to the positive terminal of power supply 21, and terminal 26 is connected to the signal return lead 29 of thyristor 29 and hence through cathode terminal 19 and load 20 to common circuit 22 or negative terminal of power supply 21. Blocking diode 28 prevents discharges of capacitors 23 and 24 during turn-on of thyristor 15. Thus the capacitor voltage divider is coupled across the power supply 21 and charged thereby.

A transistor switch $Q_1$ has its emitter coupled to an intermediate point 30 of the capacitor voltage divider and its collector to the gate of pilot thyristor 16 through resistor 31 which functions to limit peak current discharge of capacitor 24 to the gate of thyristor 16. Resistor 32 connected between the gate of thyristor 16 and the signal return lead 29 connected to terminal 26 of capacitor 24 functions to provide a low resistance gate return during the turnoff of thyristor 15. Diode 33 is coupled across capacitor 24 as a voltage limiting means.

A photo-transistor or photofet 34 has its gate coupled to terminal 26 of capacitor 24 through gate resistor 35 for providing a negative gate bias to said gate. The source of photofet 34 is also coupled to terminal 26 through load resistor 36 and the drain is coupled through base resistor 38 and the emitter base junction of transistor switch $Q_1$ whereby current flow in the source to drain current path of said photofet 34 develops a voltage of selected polarity across base resistor 37.

Reference numeral 38 indicates a photo-emitter which may be a GaAs diode pulsed by means of a potential source 39 connected in series with keying means 40 or by logic means coupled across the photo-emitter 38. The photo-emitter 38 is protected from electrostatic leakage and charges by means of an electrostatic shield 41 positioned in front of its emitting surface and a metal shield 42 which encompasses the whole device. The metal shield 42 is formed with an aperture 43 in alignment with said emitting surface which receives one end of a flexible optical fiber 44. The opposite end of the flexible optical fiber 44 is positioned adjacent the gate junction of photofet 34 whereby the light pulses of photo-emitter 38 are coupled to and irradiate the gate junction, resulting in a substantial reduction in source to drain resistance of the phototransistor 34.

In operation, power supply 21 applies a voltage of determined polarity across thyristor 15 and load impedance 20 in series which charges capacitors 23 and 24 through blocking diode 28. Photo-transistor or photofet 34 obtains its bias through the leakage current at the base-emitter junction of $Q_1$, the source of said current being the charged capacitor voltage divider 23 and 24. When photo-emitter 38 is current pulsed it emits light which is conducted therefrom by means of a fiber optic 44 to the gate junction of photofet 34. This causes a reduction in the drain to source resistance, meaning the photofet 34 turns on deriving its power through the base-emitter junction of $Q_1$ from voltage divider comprising capacitors 23 and 24. Thus when photofet 34 is in the on condition the base of $Q_1$ is effectively coupled to the opposite side or terminal 26 of capacitor 24, that is, to say, the input base-emitter, is placed across the charged capacitor 24 whereupon $Q_1$ saturates or goes into an on state producing a pulse in the output thereof which is coupled to the gate of pilot thyristor 16 turning it on. Thyristor 16 thereupon produces a pulse at its anode which gates thyristor 17 on, whereupon the voltage across the anode-cathode junction of thyristor 17 collapses and appears across load 20.

Since many means for applying a nondestructive reverse voltage to block the forward flow of current in a thyristor are well known, there is shown but schematically a reverse blocking voltage source 45 applied to the cathode circuit of thyristor 17. The external commutation signal provided by the reverse blocking voltage source 45 and applied to cathode circuit of thyristor 17 forces a reverse current flow from the cathode to anode of the thyristor and a temporary reverse voltage to appear at said anode to cathode. Subsequently a secondary current path through capacitor 24 in parallel with diode 23 decreases the remaining charge on capacitor 33, possibly reversing same, by providing a current path through resistor 46. The minus voltage charge across capacitor 24 assures absolute turnoff of $Q_1$ and photofet 34 thus aiding to the blocking voltage recovery of thyristor 15. As the commutation pulse is removed forward voltage is applied to the thyristor and capacitors 23 and 24 assume their original charging condition. The thyristor is now in condition to be triggered as aforedescribed. In the substitution of an A.C. power supply for the D.C. power supply 21, the thyristor turns off as soon as the negative cycle of the voltage is applied thereto with the subsequent charge reversed in capacitors 23 and 24 due to leakage path provided by resistor 46 and diode 33.

Recent development of high speed thyristors, and small capacitors, diodes, transistors and resistors make possible hybrid packaging techniques. Thus, thick film techniques result in small resistors and barium, beryllium, ceramic, titanate, aluminum, molybdenum and other oxides result in small capacitors. Thus it is possible to package the device of the invention with discrete components or to implement on a single silicon chip as an integral part of the thyristor. An example of such packaging is illustrated in FIG. 4 wherein the complete circuit of the invention is encapulated in a ceramic or like block 47 having the anode terminal 18 affixed to the top and the cathode terminal 19 affixed to the bottom. A threaded aperture 48 which is formed in a side of block 47 in alignment with the gate junction of photofet 34 receives the threaded end 50 of fiber optic 44. The opposite end of fiber optic 44 is sealed to photo-emitter 38 as indicated by reference numeral 51.

What is claimed is:

1. An optically triggered thyristor comprising in combination:

a power supply;

a load impedance;

a thyristor having at least an anode terminal, a cathode terminal and a gate terminal, said thyristor having a primary controllable internal impedance defined by said anode and said cathode terminals and an input impedance defined by said gate and said cathode terminals, said thyristor having an "on" state and an "off" state;

means electrically connecting said primary controllable internal impedance of said thyristor and said load impedance in series connection across said power supply;

a capacitive voltage divider including at least first and second series connected capacitors;

blocking diode means electrically connecting said capacitive voltage divider in parallel with said primary controllable internal impedance of said thyristor such that said power supply charges said first and second series connected capacitors when said thyristor is in its "off" state and said blocking diode means impedes discharge of said series connected capacitors when said thyristor is in its "on" state;

light energization means;

optically responsive switching means adapted to electrically connect said first capacitor across said input impedance of said thyristor such that the charge thereacross activates said thyristor to its "on" state such that said primary controllable internal impedance is conductive, said switching means being responsive to the light output of said light energization means.

2. An optically triggered thyristor as defined in claim 1 wherein means are provided for producing a current flow of reverse direction in said primary controllable internal impedance of said thyristor and said blocking diode means includes current limiting high impedance bypass means in parallel therewith such that said capacitive voltage divider may be at least partially discharged by a lesser reverse current flow therethrough sufficient to permit subsequent recharge of said voltage divider by said power supply.

3. An optically triggered thyristor as defined in claim 2 wherein said optically responsive switching means includes a transistor interconnection and a photo-responsive on-off means adapted to bias said transistor to a conductive state in accordance with light energization thereof.

4. An optically triggered thyristor as defined in claim 3 wherein said photo-responsive on-off means is of the field effect transistor variety and is operative to apply the voltage across said first capacitor as the gate voltage to said transistor interconnection in accordance with light energization thereof.

5. An optically triggered thyristor as defined in claim 1 wherein said power supply is of the alternating current variety.

* * * * *